(12) United States Patent
Gardner et al.

(10) Patent No.: US 11,433,664 B2
(45) Date of Patent: Sep. 6, 2022

(54) WRITING A NONVOLATILE MEMORY TO PROGRAMMED LEVELS

(71) Applicant: HEWLETT-PACKARD DEVELOPMENT COMPANY, L.P., Spring, TX (US)

(72) Inventors: James Michael Gardner, Corvallis, OR (US); Berkeley Fisher, Corvallis, OR (US); Scott A. Linn, Corvallis, OR (US)

(73) Assignee: Hewlett-Packard Development Company, L.P., Spring, TX (US)

(*) Notice: Subject to any disclaimer, the term of this patent is extended or adjusted under 35 U.S.C. 154(b) by 93 days.

(21) Appl. No.: 16/770,911

(22) PCT Filed: Feb. 6, 2019

(86) PCT No.: PCT/US2019/016736
§ 371 (c)(1),
(2) Date: Jun. 8, 2020

(87) PCT Pub. No.: WO2020/162896
PCT Pub. Date: Aug. 13, 2020

(65) Prior Publication Data
US 2021/0221123 A1    Jul. 22, 2021

(51) Int. Cl.
*B41J 2/045* (2006.01)
*G11C 7/22* (2006.01)
(Continued)

(52) U.S. Cl.
CPC ......... *B41J 2/04591* (2013.01); *B41J 2/0451* (2013.01); *B41J 2/04506* (2013.01);
(Continued)

(58) Field of Classification Search
CPC .................... B41J 2/04506; B41J 2/04508; B41J 2/04518; B41J 2/04523; B41J 2/04538;
(Continued)

(56) References Cited

U.S. PATENT DOCUMENTS 5,502,468 A    3/1996 Knierim
6,172,917 B1   1/2001 Kataoka et al.
(Continued)

FOREIGN PATENT DOCUMENTS

CN    101004948 A    7/2007
CN    101295543 A    10/2008
(Continued)

OTHER PUBLICATIONS

COEN 180, Flash Memory, Floating Gate Basics, http://www.cse.scu.edu/~tschwarz/coen180/LN/flash.html, 2003 (7 pages).
(Continued)

*Primary Examiner* — Matthew Luu
*Assistant Examiner* — Kendrick X Liu
(74) *Attorney, Agent, or Firm* — Trop Pruner & Hu PC (57) ABSTRACT

In some examples, a fluid dispensing device component includes an input to receive a control signal from the fluid dispensing system, the control signal for activating the fluidic actuators of the fluid dispensing device during a fluidic operation mode. The fluid dispensing device component includes a nonvolatile memory, and a controller to, during a memory write mode, write a first portion of the nonvolatile memory to a first programmed level responsive to the control signal being activated for a first time duration, and write a second portion of the nonvolatile memory to a second programmed level responsive to the control signal being activated for a second time duration different from the first time duration, the second programmed level being different from the first programmed level.

20 Claims, 9 Drawing Sheets

(51) Int. Cl.
*G11C 16/04* (2006.01)
*G11C 16/12* (2006.01)
*B41J 2/45* (2006.01)
*B41J 2/175* (2006.01)

(52) U.S. Cl.
CPC ....... *B41J 2/04508* (2013.01); *B41J 2/04518* (2013.01); *B41J 2/04523* (2013.01); *B41J 2/04538* (2013.01); *B41J 2/04541* (2013.01); *B41J 2/04551* (2013.01); *B41J 2/04573* (2013.01); *B41J 2/45* (2013.01); *G11C 7/22* (2013.01); *G11C 16/0408* (2013.01); *G11C 16/12* (2013.01); *B41J 2/17526* (2013.01); *G11C 2207/22* (2013.01); *G11C 2211/562* (2013.01)

(58) Field of Classification Search
CPC .......... B41J 2/04541; B41J 2/04551; B41J 2/04573; B41J 2/04591; G11C 7/22; G11C 16/0408; G11C 16/12; G11C 2207/22; G11C 2211/562
See application file for complete search history.

(56) References Cited

U.S. PATENT DOCUMENTS

| | | | |
|---|---|---|---|
| 6,247,787 B1 | 6/2001 | Giere et al. | |
| 6,729,707 B2 | 5/2004 | Corrigan | |
| 6,789,871 B2 | 9/2004 | Edelen et al. | |
| 7,310,282 B2 | 12/2007 | Edelen et al. | |
| 7,311,385 B2 | 12/2007 | Edelen et al. | |
| 7,815,273 B2 | 10/2010 | Bruce et al. | |
| 7,881,129 B2 | 2/2011 | Park et al. | |
| 8,540,348 B2 | 9/2013 | Benjamin | |
| 9,378,838 B2 | 6/2016 | Tran et al. | |
| 9,734,911 B2 | 8/2017 | Sinclair et al. | |
| 2003/0002899 A1 | 1/2003 | Furukawa et al. | |
| 2005/0041049 A1 | 2/2005 | Masuda | |
| 2005/0099458 A1 | 5/2005 | Edelen | |
| 2005/0140707 A1* | 6/2005 | Imanaka | B41J 2/04538 347/9 |
| 2006/0125859 A1 | 6/2006 | Walmsley et al. | |
| 2007/0236519 A1* | 10/2007 | Edelen | B41J 2/04586 347/9 |
| 2009/0244132 A1 | 10/2009 | Bruce | |
| 2012/0293577 A1 | 11/2012 | Kyoso et al. | |
| 2016/0314385 A1 | 10/2016 | Matsuoka et al. | |
| 2017/0239944 A1 | 8/2017 | Martin et al. | |
| 2018/0272699 A1 | 9/2018 | Martin | |

FOREIGN PATENT DOCUMENTS

| | | |
|---|---|---|
| CN | 103971739 A | 8/2014 |
| CN | 106796548 A | 5/2017 |
| TW | 588367 B | 5/2004 |
| WO | WO-2005105454 A1 | 11/2005 |
| WO | WO-2016068833 A1 | 5/2016 |

OTHER PUBLICATIONS

Hewlett-Packard Development Company, L.P., International Application No. PCT/US2019/016736 filed Feb. 6, 2019 (42 pages).
Hewlett-Packard Development Company, L.P., International Application No. PCT/US2019/016737 filed Feb. 6, 2019 (42 pages).

* cited by examiner

WRITING A NONVOLATILE MEMORY TO PROGRAMMED LEVELS

BACKGROUND

A fluid dispensing system can dispense fluid towards a target. In some examples, a fluid dispensing system can include a printing system, such as a two-dimensional (2D) printing system or a three-dimensional (3D) printing system. A printing system can include printhead devices that include fluidic actuators to cause dispensing of printing fluids.

BRIEF DESCRIPTION OF THE DRAWINGS

Some implementations of the present disclosure are described with respect to the following figures.

Throughout the drawings, identical reference numbers designate similar, but not necessarily identical, elements. The figures are not necessarily to scale, and the size of some parts may be exaggerated to more clearly illustrate the example shown. Moreover, the drawings provide examples and/or implementations consistent with the description; however, the description is not limited to the examples and/or implementations provided in the drawings.

DETAILED DESCRIPTION

In the present disclosure, use of the term "a," "an", or "the" is intended to include the plural forms as well, unless the context clearly indicates otherwise. Also, the term "includes," "including," "comprises," "comprising," "have," or "having" when used in this disclosure specifies the presence of the stated elements, but do not preclude the presence or addition of other elements.

A fluid dispensing device can include fluidic actuators that when activated cause dispensing (e.g., ejection or other flow) of a fluid. For example, the dispensing of the fluid can include ejection of fluid droplets by activated fluidic actuators from respective nozzles of the fluid dispensing device.

In other examples, an activated fluidic actuator (such as a pump) can cause fluid to flow through a fluid conduit or fluid chamber. Activating a fluidic actuator to dispense fluid can thus refer to activating the fluidic actuator to eject fluid from a nozzle or activating the fluidic actuator to cause a flow of fluid through a flow structure, such as a flow conduit, a fluid chamber, and so forth.

Activating a fluidic actuator can also be referred to as firing the fluidic actuator. In some examples, the fluidic actuators include thermal-based fluidic actuators including heating elements, such as resistive heaters. When a heating element is activated, the heating element produces heat that can cause vaporization of a fluid to cause nucleation of a vapor bubble (e.g., a steam bubble) proximate the thermal-based fluidic actuator that in turn causes dispensing of a quantity of fluid, such as ejection from an orifice of a nozzle or flow through a fluid conduit or fluid chamber. In other examples, a fluidic actuator may be a piezoelectric membrane based fluidic actuator that when activated applies a mechanical force to dispense a quantity of fluid.

In examples where a fluid dispensing device includes nozzles, each nozzle includes a fluid chamber, also referred to as a firing chamber. In addition, a nozzle can include an orifice through which fluid is dispensed, a fluidic actuator, and a sensor. Each fluid chamber provides the fluid to be dispensed by the respective nozzle.

Generally, a fluidic actuator can be an ejecting-type fluidic actuator to cause ejection of a fluid, such as through an orifice of a nozzle, or a non-ejecting-type fluidic actuator to cause flow of a fluid.

In some examples, a fluid dispensing device can be in the form of a printhead, which can be mounted to a print cartridge, a carriage, and so forth. In further examples, a fluid dispensing device can be in the form of a fluidic die. A "die" refers to an assembly where various layers are formed onto a substrate to fabricate circuitry, fluid chambers, and fluid conduits. Multiple fluidic dies can be mounted or attached to a support structure. In other examples, a fluid dispensing device can be in the form of a fluidic die sliver, which includes a thin substrate (e.g., having a thickness on the order of 650 micrometers ($\mu$m) or less) with a ratio of length to width (L/W) of at least three, for example. A die sliver can have other dimensions in other examples. Multiple fluidic die slivers can be molded into a monolithic molding structure, for example. In further examples, a fluid dispensing device can also include multiple fluidic dies or multiple fluidic die slivers.

In the present disclosure, a "fluid dispensing device component" can refer to either a fluid dispensing device, or a component that is part of, or attached to, or coupled to the fluid dispensing device.

A fluid dispensing device can include a nonvolatile memory to store data. Examples of data that can be stored in the nonvolatile memory include identification information for the fluid dispensing device (e.g., a serial number or other identifier), device component characteristics (such as a brand name, color information, license information, etc.), fluid flow characteristics such as flow rate information, configuration information to configure the fluid dispensing device, security information used for secure access of the fluid dispensing device, and so forth. The data may be encrypted, scrambled, or encoded in any way.

In some cases, it may be desirable to store an analog pattern in memory cells of the nonvolatile memory. An analog pattern can be in the form of different electrical currents or resistances corresponding to different memory cells of the nonvolatile memory. A fluid dispensing system can detect the analog pattern in the nonvolatile memory for various purposes.

Additionally, due to the small size of a fluid dispensing device, the size of the nonvolatile memory that can be included in the fluid dispensing device can be restricted, which can prevent use of a large capacity nonvolatile memory.

In accordance with some implementations of the present disclosure, a fluid dispensing device includes a nonvolatile memory and control circuitry that can set the fluid dispensing device in a number of different modes. A common control signal (such as a fire signal) can be used for different purposes in the corresponding different modes. For example, the different modes can include a fluidic operation mode during which the control signal is used to control selective activation of fluidic actuators of the fluid dispensing device. The different modes can further include a memory write mode during which the control signal is used to control writing of data to selected portions of the nonvolatile memory.

Figure 1:
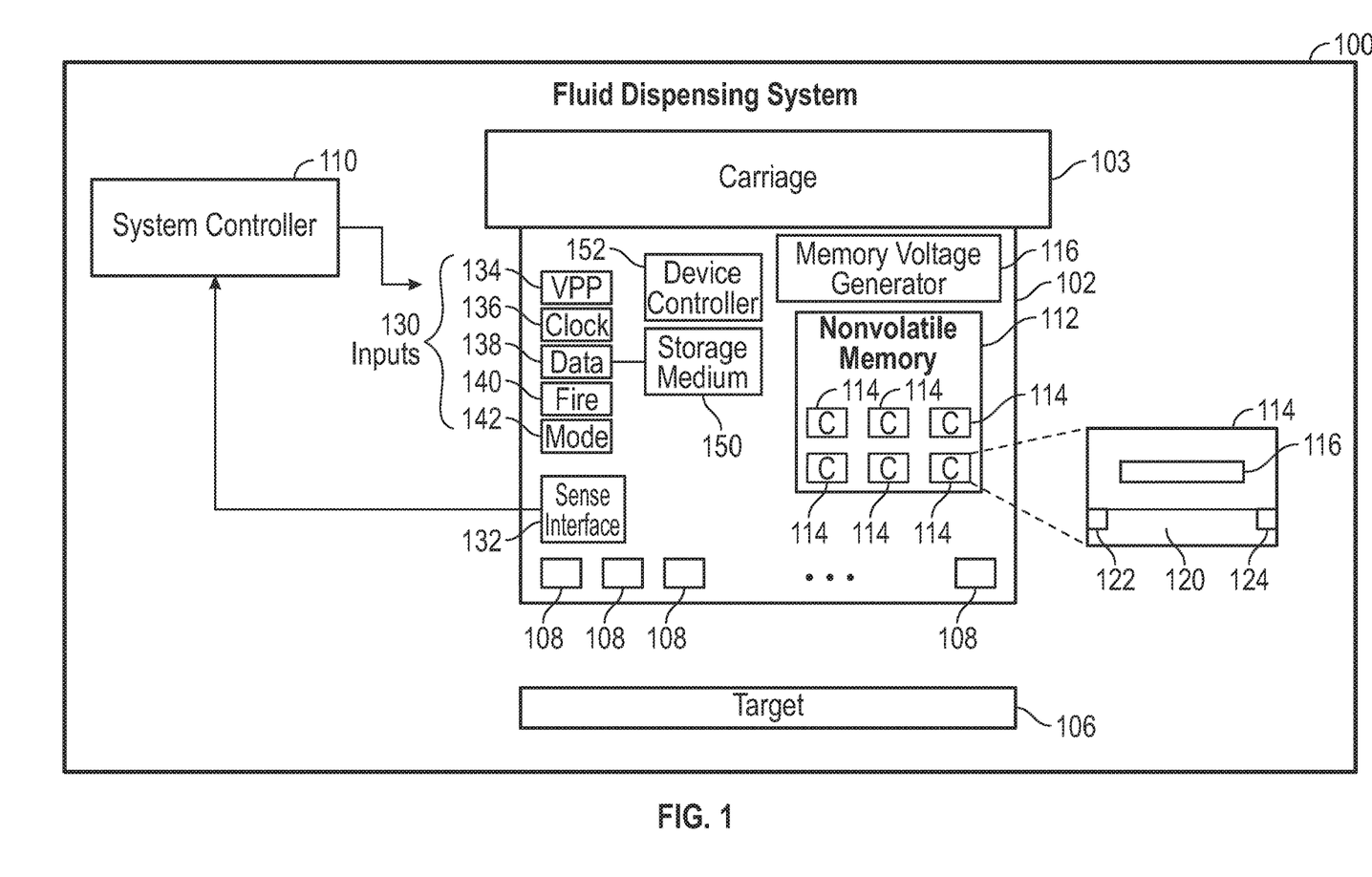
FIG. 1 is a block diagram of a fluid dispensing system according to some examples.

FIG. 1 is a block diagram of a fluid dispensing system 100, according to some examples. The fluid dispending system 100 can be a printing system, such as a 2D printing system or a 3D printing system. In other examples, the fluid dispending system 100 can be a different type of fluid dispensing system. Examples of other types of fluid dispensing systems include those used in fluid sensing systems, medical systems, vehicles, fluid flow control systems, and so forth.

The fluid dispensing system 100 includes a fluid dispensing device 102, which can be mounted to a carriage 103 (or other type of support structure) of the fluid dispensing system 100. In some examples, the fluid dispensing device 102 can be attached to a fluid cartridge (e.g., a print cartridge) that is removably mounted to the carriage 103. In other examples, the fluid dispensing device 102 can be fixedly mounted to the carriage 103.

The fluid dispensing device 102 includes orifices for dispensing fluid towards a target 106. In some examples, the carriage 103 and the target 106 are moveable with respect to one another (either the carriage 103 is moveable or the target 106 is moveable or both the carriage 103 and the target 106 are moveable).

In a 2D printing system, the fluid dispensing device 102 includes a printhead that ejects printing fluid (e.g., ink) onto a print medium, such as a paper medium, a plastic medium, and so forth.

In a 3D printing system, the fluid dispensing device 102 includes a printhead that can eject any of various different liquid agents onto a print target, where the liquid agents can include any or some combination of the following: ink, an agent used to fuse or coalesce powders of a layer of build material, an agent to detail a layer of build material (such as by defining edges or shapes of the layer of build material), and so forth. In a 3D printing system, a 3D target is built by depositing successive layers of build material onto a build platform of the 3D printing system. Each layer of build material can be processed using the printing fluid from a printhead to form the desired shape, texture, and/or other characteristic of the layer of build material.

The fluid dispensing device 102 includes an array of fluidic actuators 108. The array of fluidic actuators 108 can include a column of fluidic actuators, or multiple columns of fluidic actuators. In some examples, the fluidic actuators 108 can be organized into multiple primitives, where each primitive includes a specified number of fluidic actuators. The fluidic actuators 108 can be part of nozzles or can be associated with other types of flow structures, such as fluid conduits, fluid chambers, and so forth. Each fluidic actuator is selected by a respective different address provided by a controller (e.g., a system controller 110) in the fluid dispensing system 100.

As used here, a "controller" can refer to a hardware processing circuit, which can include any or some combination of a microprocessor, a core of a multi-core microprocessor, a microcontroller, a programmable integrated circuit (e.g., application programmable integrated circuit (ASIC), etc.), a programmable gate array, a digital signal processor, a number of discrete hardware components (e.g., timers, counters, state machines, etc.), or another hardware processing circuit. A controller can also include discrete components such as timers, counters, state machines, latches, buffers, and so forth. Alternatively, a "controller" can refer to a combination of a hardware processing circuit and machine-readable instructions (software and/or firmware) executable on the hardware processing circuit.

Although FIG. 1 shows the system controller 110 as being one block, it is noted that the system controller 110 can actually represent multiple controllers that perform respective tasks. For example, the system controller 110 can be implemented using multiple ASICs, where one ASIC can be deployed on the carriage 103, and another ASIC can be a main ASIC for controlling fluid dispensing operations (e.g., printing operations).

The fluid dispensing device 102 includes a nonvolatile memory 112 that includes an array of memory cells 114. In some examples, each memory cell 114 includes a floating gate that can be programmed in response to an input voltage applied by a memory voltage generator 116 that is part of the fluid dispensing device 102.

A schematic representation of a memory cell 114 is shown in FIG. 1, which depicts the memory cell 114 as including a floating gate 116, a substrate 120 over which the floating gate 116 is formed, and drain and source regions 122 and 124 formed in the substrate 120. Transistors coupled to the memory cell 114 are used to select (or deselect) the memory cell 114 for writing or reading. A voltage difference that exceeds a specified threshold between the drain and source regions 122 and 124 can cause a transfer of electrons to the floating gate 116, to charge the floating gate 116 to a programmed level.

The fluid dispensing device 102 includes various inputs 130, and a sense interface 132 (for inputting and outputting currents and voltages, for example). In an example, the sense interface 132 can receive a current or input voltage, and can output a corresponding voltage or current. In other examples, other forms of input/output can be performed at the sense interface 132. The inputs 130 include a programming voltage (referred to as "VPP") input 134 that provides an input voltage to the memory voltage generator 116. In some examples, the memory voltage generator 116 can include a converter to convert the input voltage VPP 134 to a programming voltage applied to perform programming of selected memory cells 114.

In other examples, the memory voltage generator 116 can be omitted, and the input voltage VPP 134 can be used for programming the memory cells 114 of the nonvolatile memory 112.

The inputs 130 also include a clock input 136, which provides a clock signal that is provided to various circuitry in the fluid dispensing device 102. The inputs 130 also include a data input 138, to receive control data (e.g., in the form of a data packet) provided by the system controller 110.

The data packet received at the data input 138 includes control information that can be used to control activation of selected fluid actuators 108. Also, as explained further below, the data packet can include information to set a mode of operation of the fluid dispensing device, where the mode of operation can include a fluidic operation mode for selective activation of fluidic actuators of the fluid dispensing device, or a memory access mode for writing or reading data of the nonvolatile memory.

As further examples, the control information included in a data packet received at the data input 138 from the system controller 110 includes primitive data and address data. Primitive data is provided in examples where the fluidic actuators 108 in the fluid dispensing device 102 are arranged in primitives. More generally, the primitive data can also be referred to as "fire data," which is data used to control activation or non-activation of a fluidic actuator (or fluidic actuators) within a primitive.

In examples where fluidic actuators 108 are grouped into primitives, the primitive data can include corresponding bits to represent which of the fluidic actuators of a primitive is (are) activated when a fire pulse is delivered to the primitive. A fire pulse corresponds to a fire signal received at a fire input 140 being activated.

The address data includes address bits that define an address for selecting fluidic actuators 108 to activate. In examples where fluidic actuators 108 are grouped into primitives, each primitive includes a set of fluidic actuators, and the fluidic actuators of the primitive are selected by respective different addresses as represented by the address bits.

The control information can also include other information that can be included into the data packet delivered by the system controller 110 to the fluid dispensing device 102.

As discussed further below, the control information in the data packet can also include a memory enable element (e.g., a memory enable bit) that when set to a specified state allows the fluid dispensing device to be set to a memory access mode.

The inputs 130 further include a mode input 142, which receives a mode signal that can be used as part of a sequence to set the fluid dispensing device 102 in a memory access mode.

In other examples, the inputs 130 of the fluid dispensing device 102 can include additional or alternative inputs.

The fluid dispensing device 102 further includes a storage medium 150, which can be in the form of a register or a latch, to store a data packet received at the data input 138. In some examples, the storage medium 150 can be in the form of a shift register to serially input bits of the data packet received at the data input 138 into the shift register on successive activations of a clock signal received at the clock input 136. In other examples, the storage medium 150 can include a register that is able to load all bits of the data packet at one time into the register.

In further examples, the storage medium 150 can include a shift register and a latch, where after a data packet is shifted into the shift register, the content of the shift register can be provided to the latch for storage. A "latch" can refer to a storage element for buffering data.

The fluid dispensing device 102 further includes a device controller 152 that is part of the fluid dispensing device 102. The device controller 152 can perform various operations of the fluid dispensing device 102, such as setting a mode of the fluid dispensing device 102, controlling activation of selected fluidic actuators 108, controlling writing or reading of the nonvolatile memory 112, and so forth.

The device controller 152 can be in the form of an ASIC, a programmable gate array, a microcontroller, a microprocessor, and so forth, or can be in the form of discrete components that cooperate to perform control tasks.

FIG. 1 shows the inputs 130 and the sense interface 132 of the fluid dispensing device 102 being coupled to the system controller 110. In some examples, the carriage 103 includes an electrical interconnect that can connect to the inputs 130 and the sense interface 132 when the fluid dispensing device 102 is attached to the carriage 130. The system controller 110 is in turn connected to the carriage 103, such as over a bus or another link.

As noted above, the combination of the mode input 142, the enable bit in a data packet, and possibly other inputs of the fluid dispensing device 102 can be used in a sequence to set the fluid dispensing device 102 in a memory access mode (memory write mode to write data to the nonvolatile memory 112 or memory read mode to read data from the nonvolatile memory 112).

Figure 2:
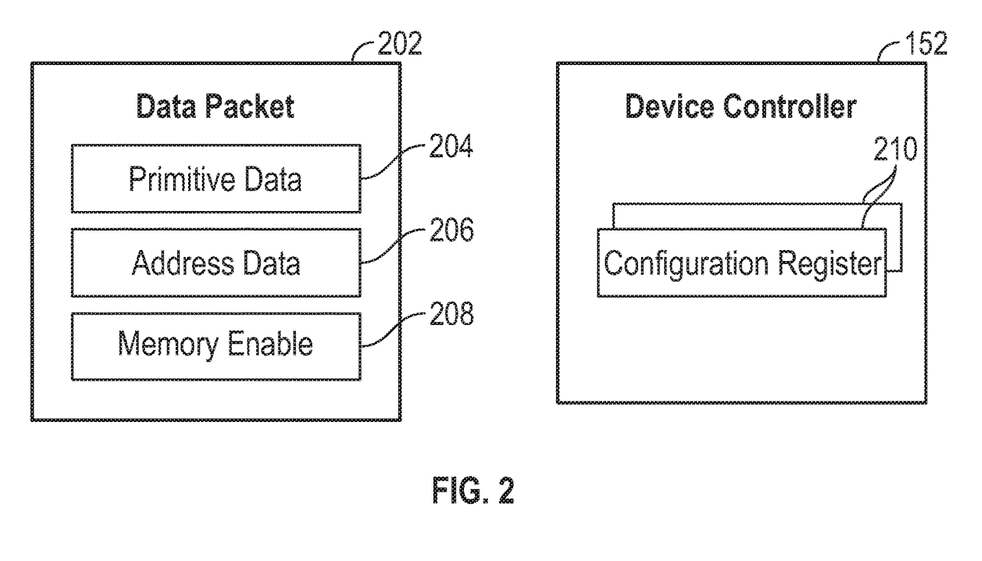
FIG. 2 is a block diagram of a device controller and a data packet according to some examples.

FIG. 2 shows an example of a data packet 202 that can be received at the data input 138 of the fluid dispensing device 102. The data packet 202 includes primitive data 204, address data 206, and a memory enable bit 208.

FIG. 2 also shows that the device controller 152 can include a configuration register 210 (or multiple configuration registers). A specific sequence of the inputs 130 and the memory enable bit 208 of the data packet 202 being set active can cause a write to the configuration register(s) 210 as part of a configuration register access operation. This specific sequence can be referred to as a memory configuration access sequence.

The information written to the configuration register(s) 210 can indicate whether the fluid dispensing device 102 is to enter a memory write mode (to write to the nonvolatile memory 112) or a memory read mode (to read from the nonvolatile memory 112). The information written to the configuration register(s) 210 can include a first value to indicate a memory write mode, or a second value to indicate a memory read mode.

Once the fluid dispensing device 102 is set in a memory access mode (memory write mode or memory read mode), activating a fire signal at the fire input 140 can being writing to or reading from selected memory cell(s) 114 as selected by the content of the data packet 202. In some examples, deactivating the fire signal can exit the memory access mode and return the fluid dispensing device 102 to the fluidic operation mode.

Figure 3:
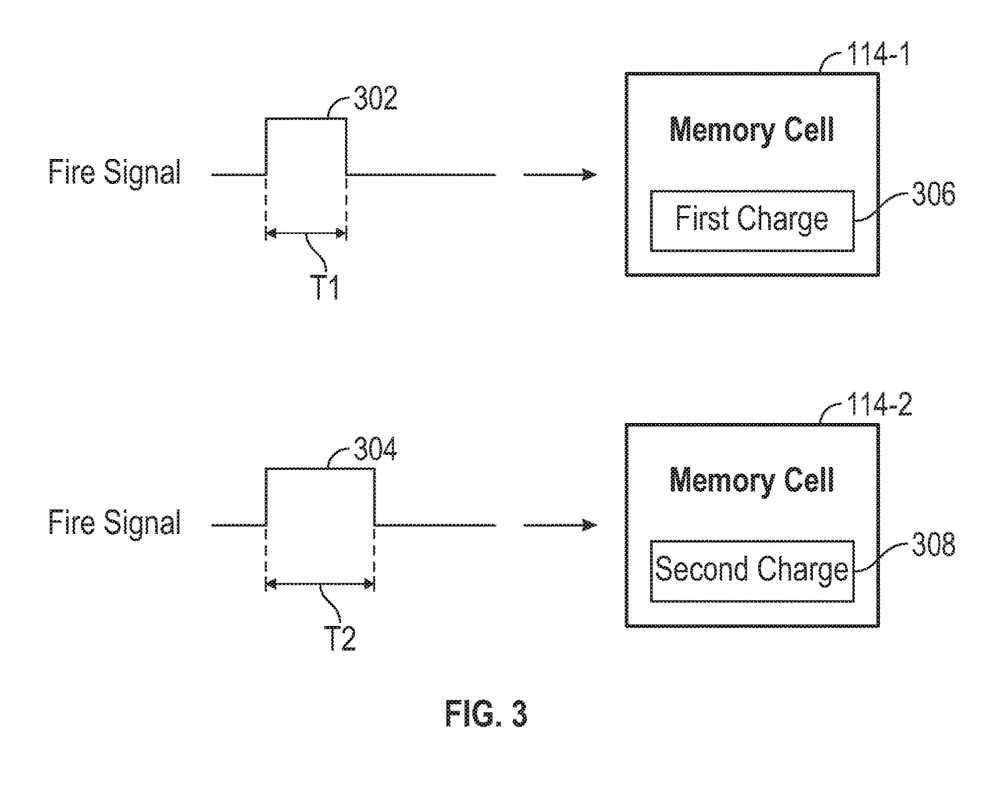
FIG. 3 shows different durations of a fire signal for programming memory cells to respective different charges, according to some examples.

Using different time durations of the fire signal to control writing of different programmed levels to a memory cell FIG. 3 shows examples of memory write operations that can be performed with respect to memory cells 114-1 and 114-2 in the non-volatile memory 112. In accordance with some implementations of the present disclosure, a time duration of a pulse of a fire signal (received at the fire input 140) controls a programmed level to which a memory cell 114 is written.

FIG. 3 shows a first fire signal pulse 302 that has a first time duration T1, and a second fire signal pulse 304 that has a second time duration T2, where T2>T1. The fire signal pulse 302 is received at the fire input 140 in a first memory write operation, and the fire signal pulse 304 is received at the fire input 140 in a second memory write operation.

In response to the first fire signal pulse 302, the memory cell 114-1 is programmed to a first charge 306 (which is a first programmed level). In response to the fire signal pulse 304, the memory cell 114-2 is programmed to a second charge 308 (which is a second program level). The different time durations of the fire signal pulses 302 and 304 produce respective different discrete programmed levels in the corresponding memory cells 114-1 and 114-2. Fire signal pulses of other different durations can cause a memory cell 114 to be programmed to yet another programmed level. By using different time durations of the fire signal, different discrete programmed levels can be written into a memory cell, to provide for multi-level storage of data in a memory cell. The multi-level storage of data can include storage of data bits represented by two programmed levels, or by more than two programmed levels. Use of multi-level storage can increase the storage capacity of the nonvolatile memory 110, without increasing the actual physical dimensions of the nonvolatile memory 110, where the physical dimensions can be based on the number of memory cells.

For example, if a memory cell can be written to three or more than three programmed levels, then the memory cell can store more than one bit of data. Such a memory cell is referred to as a multi-level memory cell.

The fire signal pulse can control when each selected memory cell 114 is active. Note that the drain or source of the selected memory cell 114 is driven to the voltage output by the memory voltage generator 116, for the time duration set by the fire signal pulse.

Note also that a memory cell can be cumulatively programmed. For examples, a first fire signal pulse of a duration is applied to a given memory cell, which causes the given memory cell to be written to a programmed level. If another fire signal pulse of a duration is subsequently applied to the given memory cell, then the given memory cell is written to a further programmed level. The charge of the given memory cell is cumulatively increased with each subsequent application of a fire signal pulse to the given memory cell.

Figure 4:
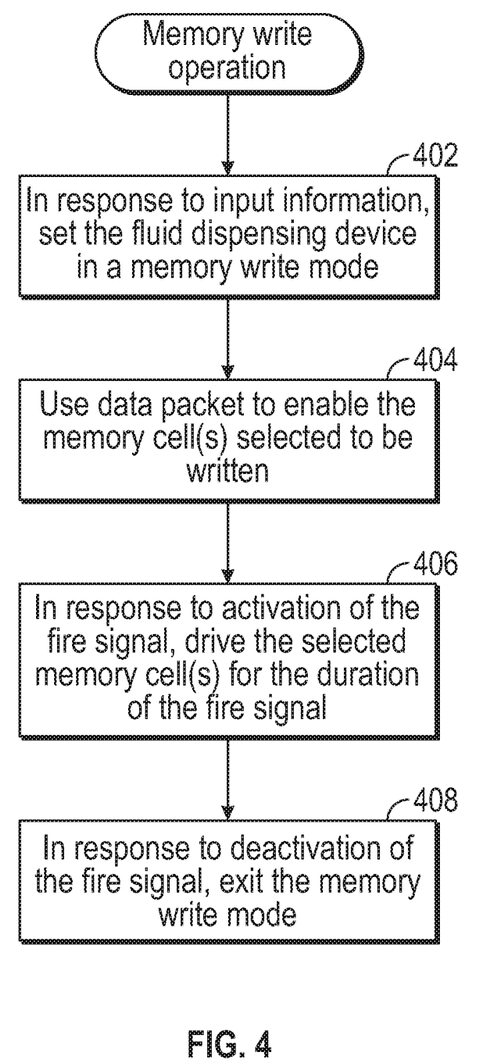
FIG. 4 is a flow diagram of a memory write operation according to some examples.

FIG. 4 is a flow diagram of a memory write operation according to some examples. The device controller 152 receives input information (which can be provided by the system controller 110 of FIG. 1, for example) to set the fluid dispensing device 102 in a memory write mode. In response to the input information, the device controller 152 sets (at 402) the fluid dispensing device 102 in the memory write mode. The input information can include a memory configuration access sequence of the inputs 130 and the memory enable bit of the data packet 202 (FIG. 2). As discussed above, the memory configuration access sequence allows information to be written to the configuration register(s) 210 (FIG. 2) to set the fluid dispensing device 102 in the memory write mode.

The device controller 152 uses the address data (and/or other data) in the received data packet (from the system controller 110) to enable (at 404) the memory cell(s) 114 that is (are) selected to be written. The device controller 152 may include logic gates that activate respective memory cell(s) responsive to the address data in the data packet, for example.

In response to activation of the fire signal by the system controller 110, the device controller 152 drives (at 406) the selected memory cell(s) for the duration of activation of the fire signal. The duration of activation of the fire signal controls the programmed level to which the selected memory cell(s) 114 is (are) written.

In response to deactivation of the fire signal by the system controller 110, the device controller 152 exits (at 408) the memory write mode, and returns to the fluidic operation mode of the fluid dispensing device 102. In other examples, exiting the memory write mode can be performed in response to a different input, such as another memory configuration access sequence.

Figure 5:
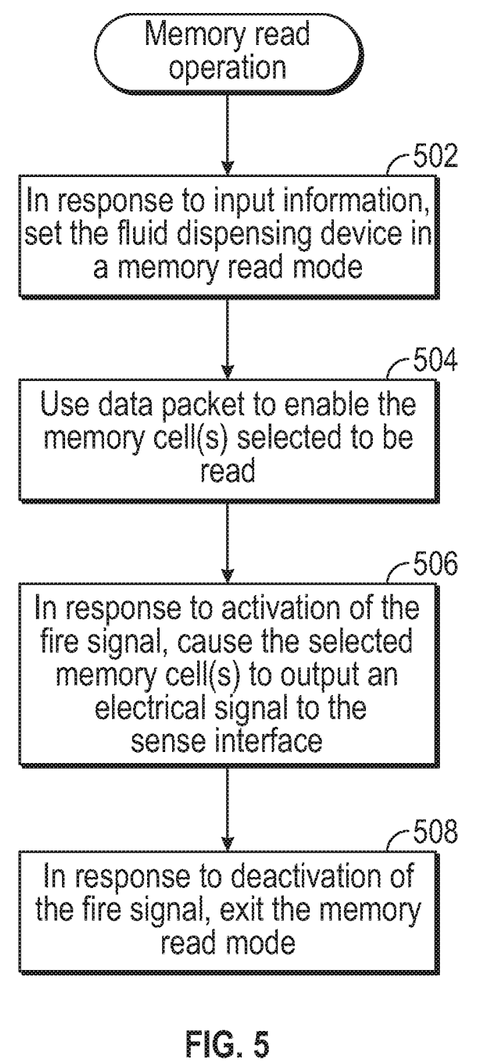
FIG. 5 is a flow diagram of a memory read operation according to some examples.

FIG. 5 is a flow diagram of a process for performing a memory read operation. The device controller 152 receives input information (which can be provided by the system controller 110 of FIG. 1, for example) to set the fluid dispensing device 102 in a memory read mode. In response to the input information, the device controller 152 sets (at 502) the fluid dispensing device 102 in the memory read mode. The input information can include a memory configuration access sequence of the inputs 130 and the memory enable bit of the data packet 202 (FIG. 2). As discussed above, the memory configuration access sequence allows information to be written to the configuration register(s) 210 (FIG. 2) to set the fluid dispensing device 102 in the memory read mode.

The device controller 152 uses the address data (and/or other data) in the received data packet (from the system controller 110) to enable (at 504) the memory cell(s) 114 that is (are) selected to be read.

In response to activation of the fire signal by the system controller 110, the device controller 152 causes (at 506) the selected memory cell(s) 114 to output an electrical signal (current or voltage) to the sense interface 132, which can be read by the system controller 110. For example, the device controller 152 can turn on switches that connect the selected memory cell(s) 114 to the sense interface 132.

In response to deactivation of the fire signal by the system controller 110, the device controller 152 exits (at 508) the memory read mode, and returns to the fluidic operation mode of the fluid dispensing device 102. In other examples, exiting the memory read mode can be performed in response to a different input, such as another memory configuration access sequence.

Using Different Programming Voltages to Control Writing of Different Programmed Levels to a Memory Cell In further examples, as an alternative or in addition to using different time durations of the fire signal received at the fire input 140 to control the programmed level of a memory cell, different programming voltages can be used to write different programmed levels to a memory cell.

Figure 6:
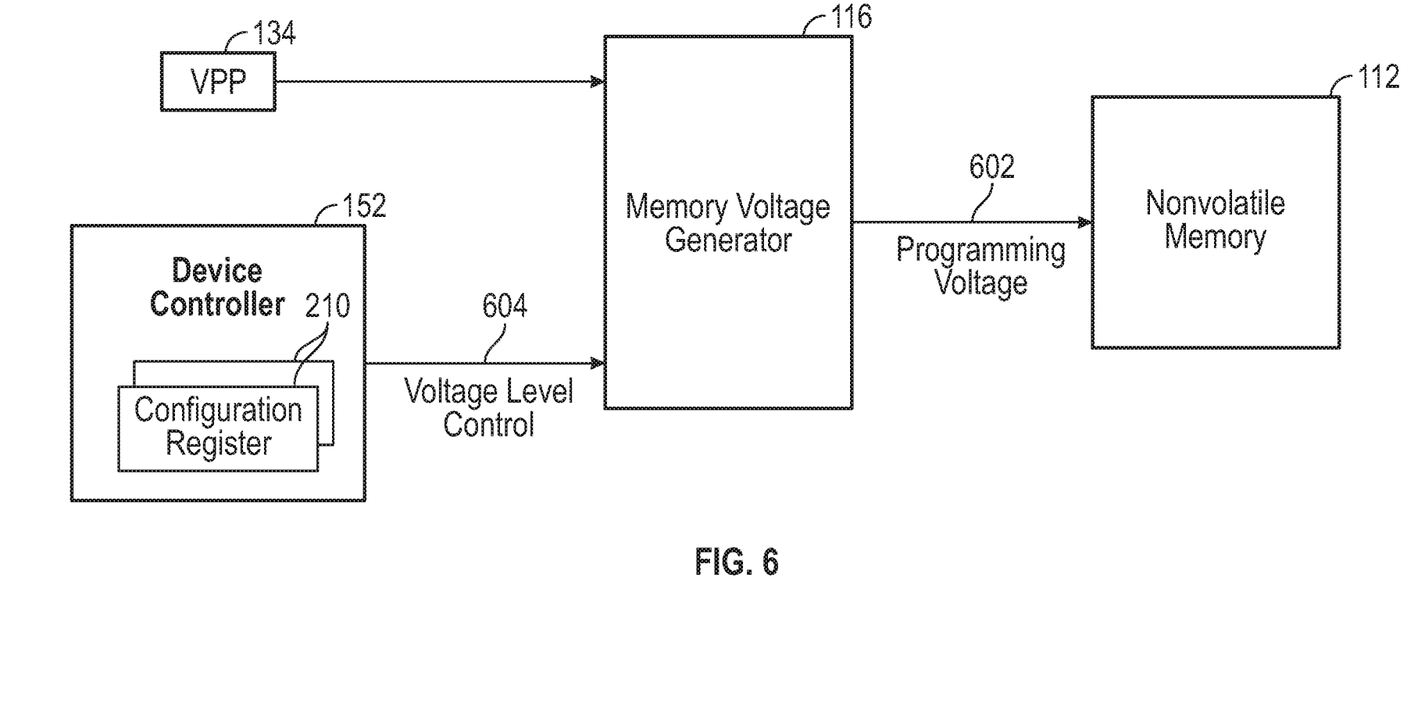
FIG. 6 is a block diagram of an arrangement in a fluid dispensing device for generating a programming voltage according to some examples.

FIG. 6 is a block diagram of an example arrangement that includes the memory voltage generator 116, which receives the input voltage VPP 134, and produces a programming voltage 602 that is provided to the nonvolatile memory 112. The programming voltage 602 controls the voltage to which a drain or source of a selected memory cell 114 is driven when programming the memory cell 114.

In some examples, the memory voltage generator 116 is a voltage converter that converts the input voltage VPP 134 to the programming voltage 602. The programming voltage 602 output by the voltage converter can be lower, the same as, or greater than the input voltage VPP 134.

In some examples, varying the voltage level of the input voltage VPP 134 causes a corresponding variation in the voltage level of the programming voltage 602. For example, if the system controller 110 sets the input voltage VPP 134 at voltage level 1, then the programming voltage 602 is set to a corresponding voltage level A (where the voltage level A can be less than, the same as, or greater than the voltage level 1). If the system controller 110 sets the input voltage VPP 134 at voltage level 2, then the programming voltage 602 is set to a corresponding voltage level B, if the system controller 110 sets the input voltage VPP 134 at voltage level 3, then the programming voltage 602 is set to a corresponding voltage level C, and so forth. In the foregoing examples, voltage levels 1, 2, and 3 are different from one another, and voltage levels A, B, and C are different from one another. As a specific example, voltage levels A, B, and C can be 9 volts (V), 10 V, and 11 V, respectively, or some other voltage levels.

In the foregoing examples, the programmed level at which a selected memory cell 114 is written is controlled by the system controller 110 (based on the voltage level of the input voltage VPP 134).

In alternative examples, instead of or in addition to varying the input voltage VPP 134, the system controller 110 can cause the device controller 152 to selectively set the fluid dispensing device 102 in one of multiple different memory write modes. In such examples, the memory voltage generator 116 is a programmable voltage generator that responds to a voltage level control indication 604 from the device controller 152 to control the voltage level of the programming voltage 602 produced by the memory voltage generator 116.

For example, if the input information from the system controller 110 causes the device controller 152 to enter memory write mode 1, then the device controller 152 produces a first voltage level control indication 604 that causes the memory voltage generator 116 to produce the programming voltage 602 with a first voltage level. Similarly, if the input information from the system controller 110 causes the device controller 152 to enter memory write mode 2, then the device controller 152 produces a second voltage level control indication 604 that causes the memory voltage generator 116 to produce the programming voltage 602 with a second voltage level. If the input information from the system controller 110 causes the device controller 152 to enter memory write mode 3, then the device controller 152 produces a third voltage level control indication 604 that causes the memory voltage generator 116 to produce the programming voltage 602 with a third voltage level, and so forth.

The input information provided by the system controller 110 to set the device controller 102 in the respective memory write mode can include a memory configuration access sequence of the inputs 130 and the memory enable bit of the data packet 202 (FIG. 2). As discussed above, the memory configuration access sequence allows information to be written to the configuration register(s) 210 (FIG. 2) to set the fluid dispensing device 102 in a memory write mode. In this case, different information written to the configuration register(s) 210 can cause the device controller to enter different memory write modes that result in different voltage levels of the programming voltage 602.

Note also that a memory cell can be cumulatively programmed. For examples, a given memory cell can be written to a programmed level in response to a first programming voltage. The given memory cell may be subsequently programmed using a second programming voltage (higher than the first programming voltage) to incrementally program the given memory cell to a new level.

Figure 7:
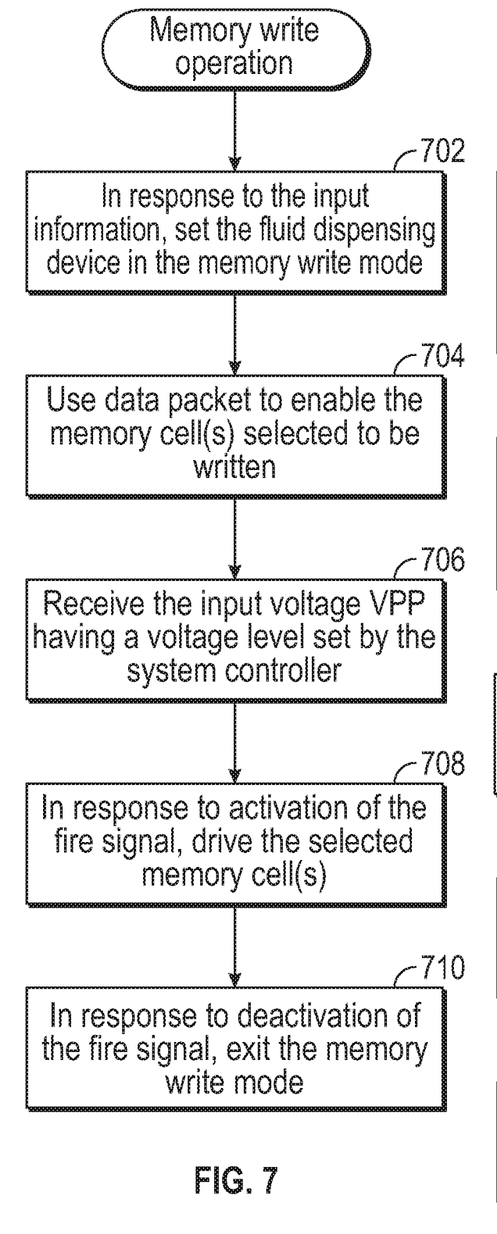
FIGS. 7 and 8 are flow diagrams of memory write operations according to further examples.

FIG. 7 is a flow diagram of a memory write operation according to examples in which the input voltage VPP 134 is varied by the system controller 110 to produce different programming voltage levels in the fluid dispensing device 102. The device controller 152 receives input information (which can be provided by the system controller 110 of FIG. 1, for example) to set the fluid dispensing device 102 in a memory write mode. In response to the input information, the device controller 152 sets (at 702) the fluid dispensing device 102 in the memory write mode. The input information can include a memory configuration access sequence of the inputs 130 and the memory enable bit of the data packet 202 (FIG. 2).

The device controller 152 uses the address data (and/or other data) in the received data packet (from the system controller 110) to enable (at 704) the memory cell(s) 114 that is (are) selected to be written.

The fluid dispensing device 102 receives (at 706) the input voltage VPP 134 having a voltage level set by the system controller 110. Different voltage levels of the input voltage VPP 134 are selectively set by the system controller 110 to cause different programmed levels to be stored in the selected memory cell(s) 114.

In response to activation of the fire signal by the system controller 110, the device controller 152 drives (at 708) the selected memory cell(s), which is written to the programmed level corresponding to the voltage level of the input voltage VPP 134.

In response to deactivation of the fire signal by the system controller 110, the device controller 152 exits (at 710) the memory write mode, and returns to the fluidic operation mode of the fluid dispensing device 102. In other examples, exiting the memory write mode can be performed in response to a different input, such as another memory configuration access sequence.

Figure 8:
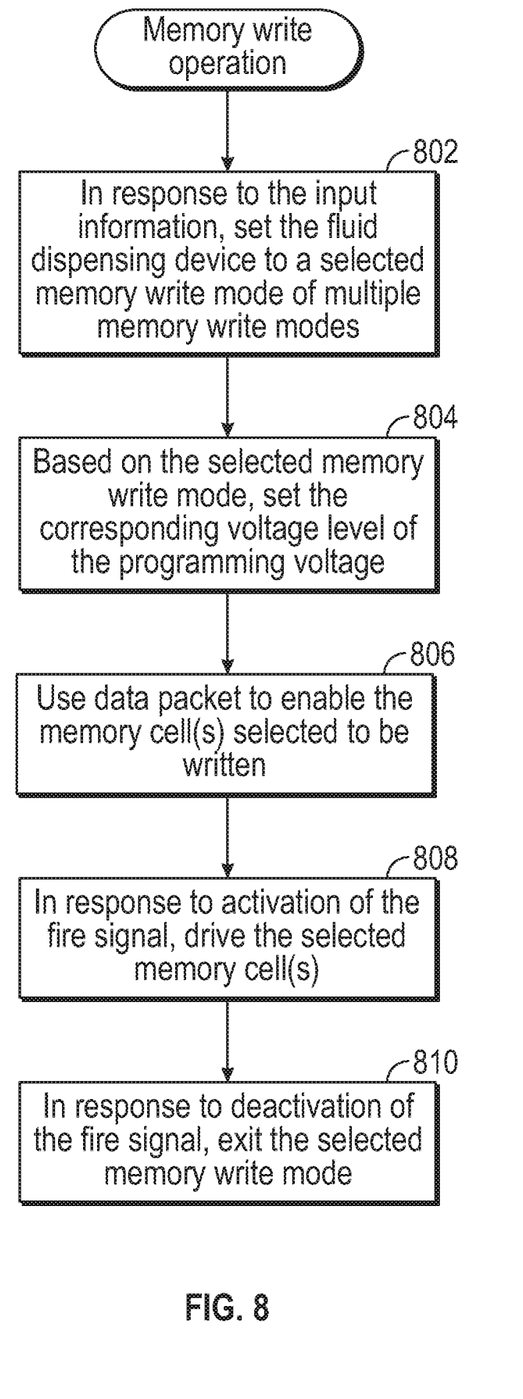

FIG. 8 is a flow diagram of a memory write operation according to examples in which the fluid dispensing device 102 is set to different memory write modes to produce different programming voltage levels in the fluid dispensing device 102. The device controller 152 receives input information (which can be provided by the system controller 110 of FIG. 1, for example) to set the fluid dispensing device 102 in a memory write mode. In response to the input information, the device controller 152 sets (at 802) the fluid dispensing device 102 to a selected memory write mode of the multiple memory write modes. The input information can include a memory configuration access sequence of the inputs 130 and the memory enable bit of the data packet 202 (FIG. 2). Different input information can cause selection of respective different memory write modes.

Based on the selected memory write mode, the memory voltage generator 116 in the fluid dispensing device 102 sets (at 804) the corresponding voltage level of the programming voltage 602.

The device controller 152 uses the address data (and/or other data) in the received data packet (from the system controller 110) to enable (at 806) the memory cell(s) 114 that is (are) selected to be written.

In response to activation of the fire signal by the system controller 110, the device controller 152 drives (at 808) the selected memory cell(s), which is written to the programmed level corresponding to the voltage level of the programming voltage 602 set according to the selected memory write mode.

In response to deactivation of the fire signal by the system controller 110, the device controller 152 exits (at 810) the selected memory write mode, and returns to the fluidic operation mode of the fluid dispensing device 102. In other examples, exiting the memory write mode can be performed in response to a different input, such as another memory configuration access sequence.

In further examples, the writing of memory cells 114 of the nonvolatile memory 112 to different programmed levels can be based on use of both different programming voltages and different time durations of the fire signal. The different combinations of programming voltages and fire signal activation time durations can map to a larger number of different programmed levels of memory cells.

Figure 9:
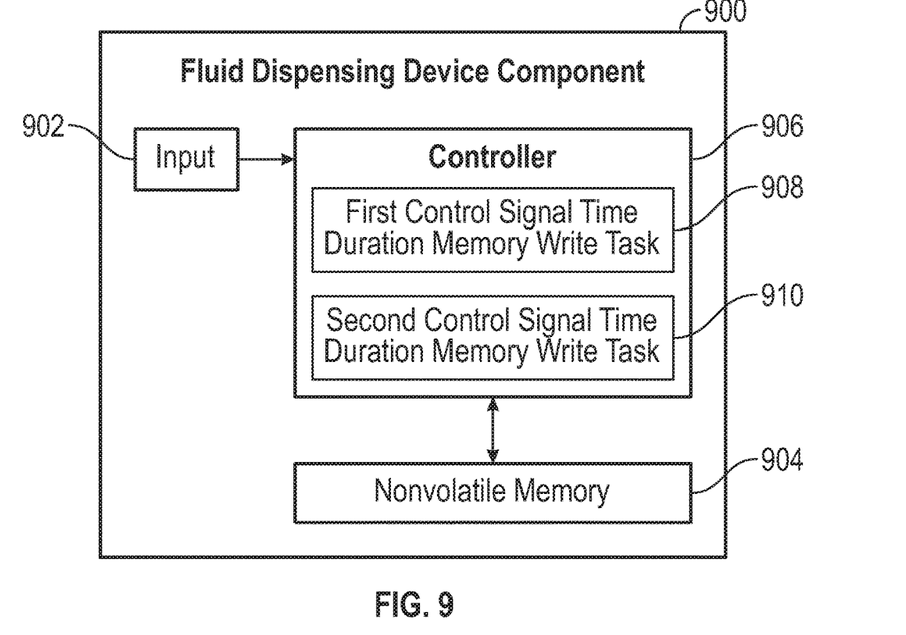
FIG. 9 is a block diagram of a fluid dispensing device component according to some examples.

FIG. 9 is a block diagram of a fluid dispensing device component 900 that includes an input 902 (e.g., the fire input 140 of FIG. 1) to receive a control signal from the fluid dispensing system, the control signal for activating the fluidic actuators of the fluid dispensing device during a fluidic operation mode.

The fluid dispensing device component 900 can be a fluid dispensing device or a component that is part of, or attached to, or coupled to the fluid dispensing device.

The fluid dispensing device component 900 includes a nonvolatile memory 904, and a controller 906 (e.g., the device controller 152 of FIG. 1) to perform the following tasks during a memory write mode. The tasks of the controller 906 include a first control signal time duration memory write task 908 to write a first portion (e.g., a selected memory cell or multiple selected memory cells) of the nonvolatile memory 904 to a first programmed level responsive to the control signal being activated for a first time duration. The tasks of the controller 906 include a second control signal time duration memory write task 910 to write a second portion of the nonvolatile memory 904 to a second programmed level responsive to the control signal being activated for a second time duration different from the first time duration, the second programmed level being different from the first programmed level.

In further examples, the controller 906 is to, during the memory write mode, write at least one further portion of the nonvolatile memory 906 to at least one corresponding further programmed level responsive to the control signal being activated for at least one corresponding further third time duration different from the first and second time durations, the at least one further programmed level being different from the first and second programmed levels.

Figure 10:
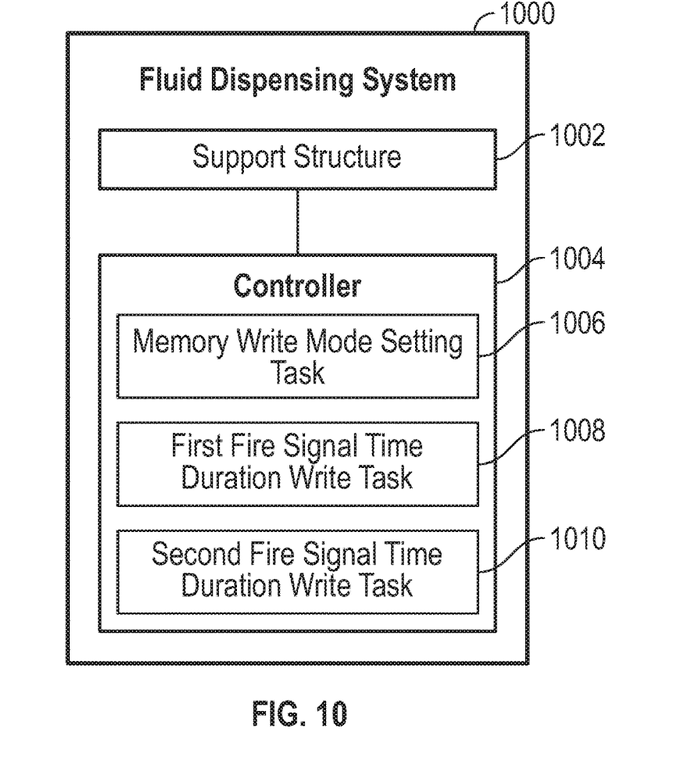
FIG. 10 is a block diagram of a fluid dispensing system according to some examples.

FIG. 10 is a block diagram of a fluid dispensing system 1000 that includes a support structure 1002 (e.g., the carriage 103 of FIG. 1) to receive a fluid dispensing device including a nonvolatile memory and an input to receive a fire signal. The fluid dispensing system 1000 includes a controller 1004 (e.g., the system controller 110 of FIG. 1) to perform various tasks.

The tasks of the controller 1004 include a memory write mode setting task 1006 to set the fluid dispensing device to a memory write mode. The tasks of the controller 1004 include the following tasks that are performed after setting the fluid dispensing device to the memory write mode.

Such tasks include a first fire signal time duration memory write task 1008 to activate the fire signal for a first time duration to write a first portion of the nonvolatile memory to a first programmed level, and a second fire signal time duration memory write task 1010 to activate the fire signal for a second time duration to write a second portion of the nonvolatile memory to a second programmed level, the second time duration being different from the first time duration, and the second programmed level being different from the first programmed level.

Figure 11:
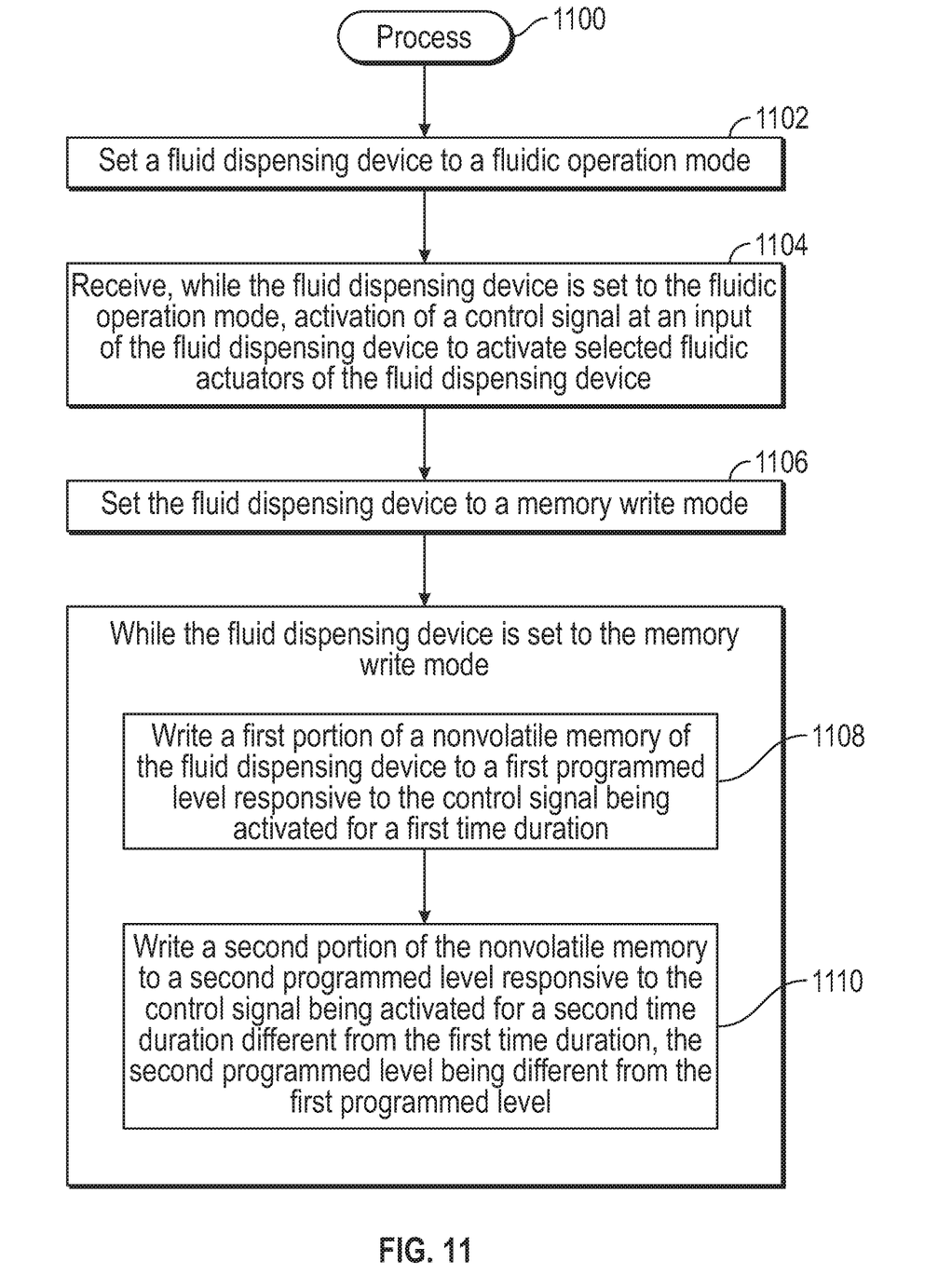
FIG. 11 is a flow diagram of a process according to some examples.

FIG. 11 is a flow diagram of a process 1100 of a fluid dispensing device according to some examples. The process 1100 includes setting (at 1102) a fluid dispensing device to a fluidic operation mode. Note that the fluidic operation mode of the fluid dispensing device can be a default mode of operation of the fluid dispensing device, unless the fluid dispensing device is set to a memory access mode or other mode.

The process 1100 includes receiving (at 1104), while the fluid dispensing device is set to the fluidic operation mode, activation of a control signal at an input of the fluid dispensing device to activate selected fluidic actuators of the fluid dispensing device.

The process 1100 includes setting (at 1106) the fluid dispensing device to a memory write mode. While the fluid dispensing device is set to the memory write mode, the process 1100 includes writing (at 1108) a first portion of a nonvolatile memory of the fluid dispensing device to a first programmed level responsive to the control signal being activated for a first time duration, and writing (at 1110) a second portion of the nonvolatile memory to a second programmed level responsive to the control signal being activated for a second time duration different from the first time duration, the second programmed level being different from the first programmed level.

Figure 12:
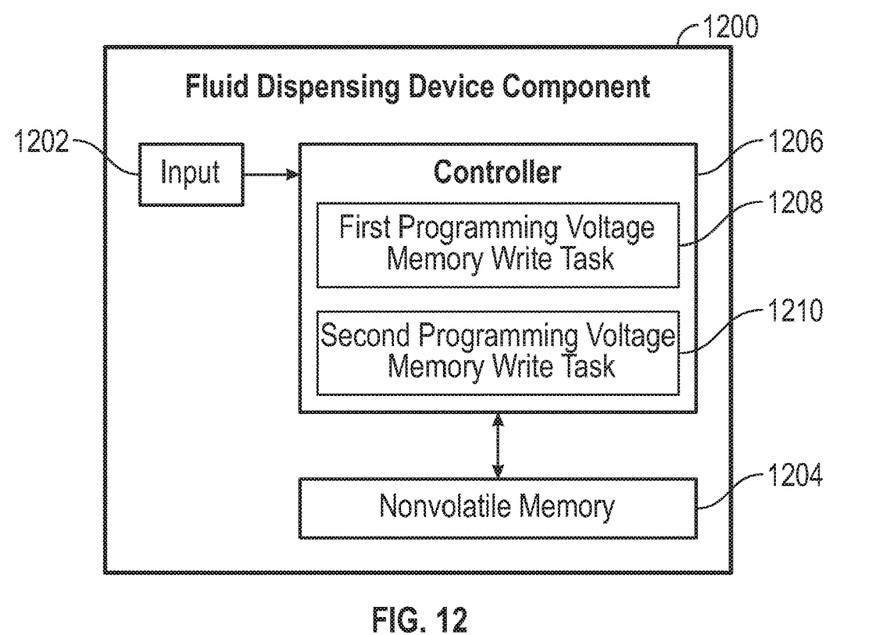
FIG. 12 is a block diagram of a fluid dispensing device component according to further examples.

FIG. 12 is a block diagram of a fluid dispensing device component 1200 that includes an input 1202 (e.g., the fire input 140 of FIG. 1) to receive a control signal from the fluid dispensing system, the control signal for activating fluidic actuators during a fluidic operation mode.

The fluid dispensing device component 1200 includes a nonvolatile memory 1204, a controller 1206 (e.g., the device controller 152 of FIG. 1) to perform the following tasks during a memory write mode. The tasks of the controller 1206 include a first programming voltage memory write task 1208 to write a first portion of the nonvolatile memory to a first programmed level responsive to application of a first programming voltage and activation of the control signal, and a second programming voltage memory write task 1210 to write a second portion of the nonvolatile memory to a second programmed level responsive to application of a second programming voltage different from the first programming voltage and activation of the control signal.

Figure 13:
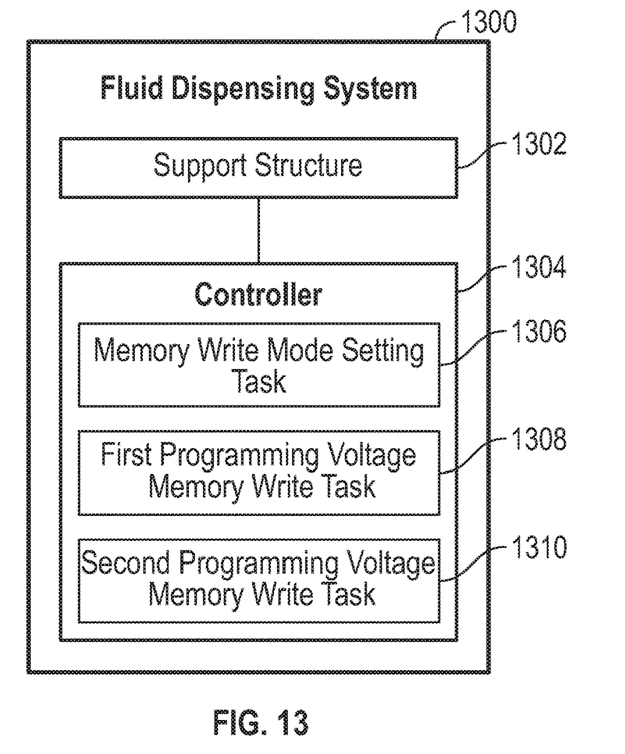
FIG. 13 is a block diagram of a fluid dispensing system according to further examples.

FIG. 13 is a block diagram of a fluid dispensing system 1300 that includes a support structure 1302 (e.g., the carriage 103 of FIG. 1) to receive a fluid dispensing device including a nonvolatile memory and an input to receive a fire signal. The fluid dispensing system 1300 includes a controller 1304 (e.g., the system controller 110 of FIG. 1) to perform various tasks. The tasks of the controller 1304 include a memory write mode setting task 1306 to set the fluid dispensing device to a memory write mode.

The tasks of the controller 1304 include the following tasks that are performed after setting the fluid dispensing device to the memory write mode. Such tasks include a first programming voltage memory write task 1308 to control application of a first programming voltage in the fluid dispensing device to write a first portion of the nonvolatile memory to a first programmed level responsive to activation of the fire signal, and a second programming voltage memory write task 1310 to control application of a second programming voltage in the fluid dispensing device to write a second portion of the nonvolatile memory to a second programmed level different from the first programming voltage responsive to activation of the fire signal.

Figure 14:
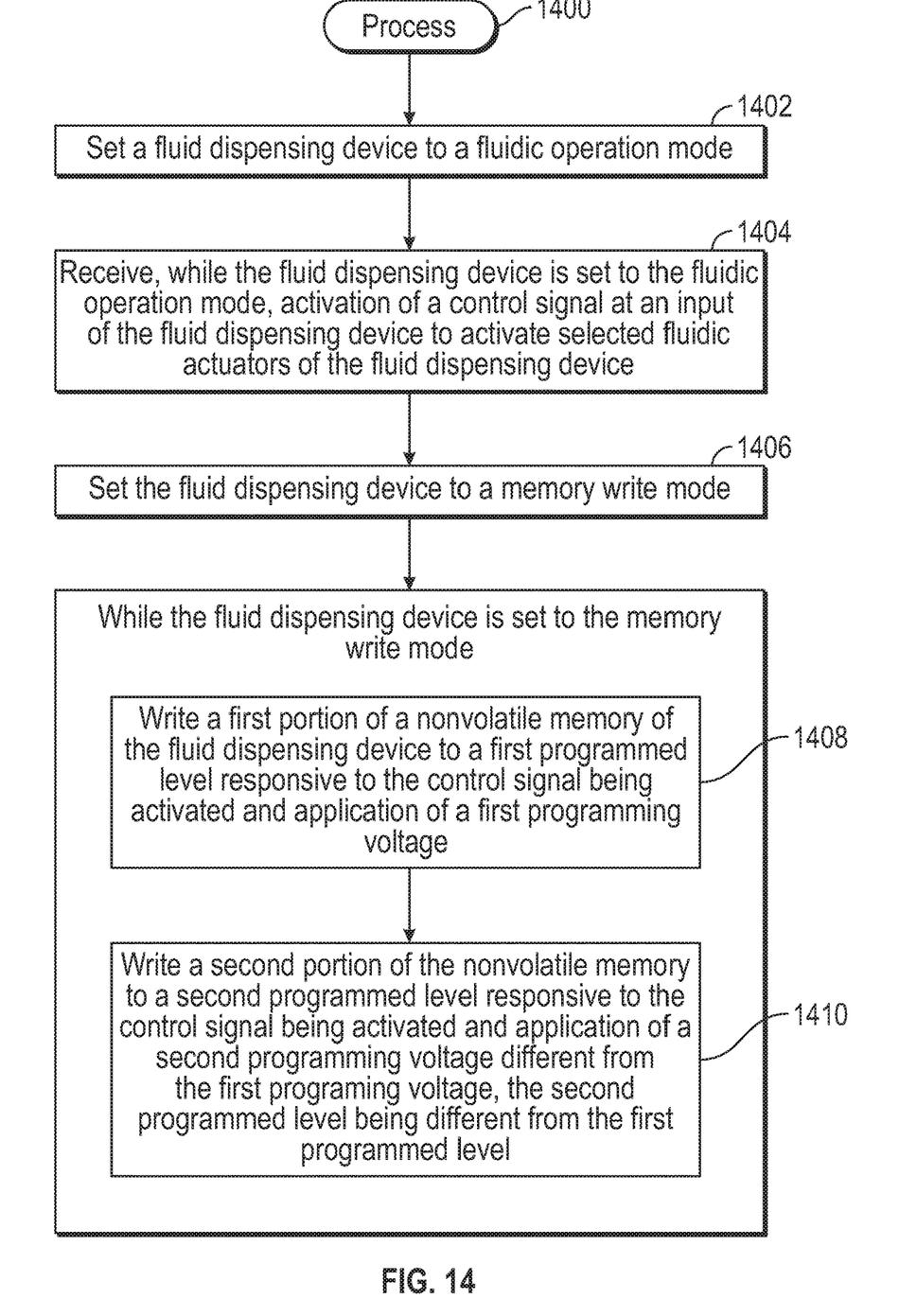
FIG. 14 is a flow diagram of a process according to further examples.

FIG. 14 is a flow diagram of a process 1400 of a fluid dispensing device according to some examples. The process 1400 includes setting (at 1402) a fluid dispensing device to a fluidic operation mode.

The process 1400 includes receiving (at 1404), while the fluid dispensing device is set to the fluidic operation mode, activation of a control signal at an input of the fluid dispensing device to activate selected fluidic actuators of the fluid dispensing device.

The process 1400 includes setting (at 1406) the fluid dispensing device to a memory write mode. While the fluid dispensing device is set to the memory write mode, the process 1400 includes writing (at 1408) a first portion of a nonvolatile memory of the fluid dispensing device to a first programmed level responsive to the control signal being activated and application of a first programming voltage, and writing (at 1410) a second portion of the nonvolatile memory to a second programmed level responsive to the control signal being activated and application of a second programming voltage different from the first programing voltage, the second programmed level being different from the first programmed level.

The various tasks of controllers discussed above can be performed by machine-readable instructions stored in a non-transitory machine-readable or computer-readable storage medium. The machine-readable instructions upon execution by a controller or a system can perform various tasks, such as those of the various controllers discussed above. The storage medium can include any or some combination of the following: a semiconductor memory device such as a dynamic or static random access memory (a DRAM or SRAM), an erasable and programmable read-only memory (EPROM), an electrically erasable and programmable read-only memory (EEPROM) and flash memory; a magnetic disk such as a fixed, floppy and removable disk; another magnetic medium including tape; an optical medium such as a compact disc (CD) or a digital video disc (DVD); or another type of storage device. Note that the instructions discussed above can be provided on one computer-readable or machine-readable storage medium, or alternatively, can be provided on multiple computer-readable or machine-readable storage media distributed in a large system having possibly plural nodes. Such computer-readable or machine-readable storage medium or media is (are) considered to be part of an article (or article of manufacture). An article or article of manufacture can refer to any manufactured single component or multiple components. The storage medium or media can be located either in the machine running the machine-readable instructions, or located at a remote site from which machine-readable instructions can be downloaded over a network for execution.

In the foregoing description, numerous details are set forth to provide an understanding of the subject disclosed herein. However, implementations may be practiced without some of these details. Other implementations may include modifications and variations from the details discussed above. It is intended that the appended claims cover such modifications and variations.

What is claimed is:

1. A fluid dispensing device component comprising:
   an input to receive a control signal from a fluid dispensing system, the control signal when activated delivering a signal pulse for activating fluidic actuators of a fluid dispensing device during a fluidic operation mode;
   a nonvolatile memory; and
   a controller to, during a memory write mode:
      write a first portion of the nonvolatile memory to a first programmed level responsive to the control signal being activated for a first time duration, and
      write a second portion of the nonvolatile memory to a second programmed level responsive to the control signal being activated for a second time duration different from the first time duration, the second programmed level being different from the first programmed level.

2. The fluid dispensing device component of claim 1, wherein the controller is to, during the memory write mode, write at least one further portion of the nonvolatile memory to at least one corresponding further programmed level responsive to the control signal being activated for at least one corresponding further time duration different from the first and second time durations, the at least one further programmed level being different from the first and second programmed levels.

3. The fluid dispensing device component of claim 1, further comprising the fluidic actuators.

4. The fluid dispensing device component of claim 1, wherein the controller is to, in response to first mode control information received at a data input of the fluid dispensing device component, set the fluidic operation mode of the fluid dispensing device to control activation of the fluidic actuators using the control signal, and the controller is to, in response to different second mode control information received at the data input of the fluid dispensing device component, set the memory write mode of the fluid dispensing device different from the fluidic operation mode to control writing of the nonvolatile memory using the control signal.

5. The fluid dispensing device component of claim 4, wherein the control signal comprises a fire signal that when activated causes the fluidic actuators to dispense fluid through orifices of the fluid dispensing device during the fluidic operation mode.

6. The fluid dispensing device component of claim 1, wherein the controller is to set the memory write mode of the fluid dispensing device responsive to a configuration register access.

7. The fluid dispensing device component of claim 1, wherein the nonvolatile memory comprises memory cells with floating gates.

8. The fluid dispensing device component of claim 1, further comprising:
   an output accessible by the fluid dispensing system, the output coupled to the nonvolatile memory and to provide data from the nonvolatile memory during a read operation of the nonvolatile memory.

9. The fluid dispensing device component of claim 8, wherein the data provided by the output from the nonvolatile memory is an analog value.

10. The fluid dispensing device component of claim 8, wherein the read operation is responsive to activation of the control signal.

11. The fluid dispensing device component of claim 1, wherein the controller is to, in response to a first value at a mode input of the fluid dispensing device component, set the fluid operation mode of the fluid dispensing device to control activation of the fluidic actuators using the control signal, and the controller is to, in response to a different second value at the mode input of the fluid dispensing device component, set the memory write mode of the fluid dispensing device to control writing of the nonvolatile memory using the control signal.

12. The fluid dispensing device component of claim 1, wherein the controller is to further write additional programmed levels to respective portions of the nonvolatile memory in response to different programming voltages applied to the nonvolatile memory.

13. The fluid dispensing device component of claim 12, further comprising a memory voltage generator to generate the different programming voltages responsive to different input voltages received at the fluid dispensing device component.

14. The fluid dispensing device component of claim 12, further comprising a memory voltage generator to generate the different programming voltages responsive to the fluid dispensing device being set to corresponding different memory write modes.

15. A fluid dispensing system comprising:
a support structure to receive a fluid dispensing device comprising a nonvolatile memory and an input to receive a fire signal; and
a controller to:
   set the fluid dispensing device to a memory write mode;
   after setting the fluid dispensing device to the memory write mode:
      activate the fire signal for a first time duration to write a first portion of the nonvolatile memory to a first programmed level, and
      activate the fire signal for a second time duration to write a second portion of the nonvolatile memory to a second programmed level, the second time duration being different from the first time duration, and the second programmed level being different from the first programmed level;
   set the fluid dispensing device to a fluidic operation mode; and
   after setting the fluid dispensing device to the fluidic operation mode:
      activate the fire signal to deliver a signal pulse that causes activation of fluidic actuators in the fluid dispensing device to dispense fluid.

16. The fluid dispensing system of claim 15, wherein the controller is to further:
read data of the nonvolatile memory at an output of the fluid dispensing device.

17. The fluid dispensing system of claim 15, wherein the controller is to set the fluid dispensing device to the memory write mode based on providing a first input to the fluid dispensing device during a configuration operation of the fluid dispensing device, and the controller is to set the fluid dispensing device to the fluidic operation mode based on providing a second input to the fluid dispensing device during the configuration operation of the fluid dispensing device, the second input different from the first input.

18. The fluid dispensing system of claim 17, wherein the first input comprises one of first mode control information provided to a data input of the fluid dispensing device, or a first value provided to a mode input of the fluid dispensing device, and
wherein the second input comprises one of second mode control information provided to the data input of the fluid dispensing device, or a second value provided to the mode input of the fluid dispensing device.

19. A method comprising:
setting a fluid dispensing device to a fluidic operation mode based on a first input received by the fluid dispensing device during a configuration operation of the fluid dispensing device;
while the fluid dispensing device is set to the fluidic operation mode, receiving an activation signal pulse delivered by an activation of a control signal at an input of the fluid dispensing device to activate fluidic actuators of the fluid dispensing device;
setting the fluid dispensing device to a memory write mode based on a second input received by the fluid dispensing device during the configuration operation of the fluid dispensing device, the second input being different from the first input; and
while the fluid dispensing device is set to the memory write mode:
   writing a first portion of a nonvolatile memory of the fluid dispensing device to a first programmed level responsive to the control signal being activated for a first time duration, and
   writing a second portion of the nonvolatile memory to a second programmed level responsive to the control signal being activated for a second time duration different from the first time duration, the second programmed level being different from the first programmed level.

20. The method of claim 19, further comprising:
setting the fluid dispensing device to a memory read mode; and
while the fluid dispensing device is set to the memory read mode, output data of the nonvolatile memory at an output of the fluid dispensing device.

* * * * *